(12) United States Patent
Kamp et al.

(10) Patent No.: US 10,714,354 B2
(45) Date of Patent: *Jul. 14, 2020

(54) SELF LIMITING LATERAL ATOMIC LAYER ETCH

(71) Applicant: Lam Research Corporation, Fremont, CA (US)

(72) Inventors: Tom Kamp, San Jose, CA (US); Neema Rastgar, Pleasanton, CA (US); Michael Carl Drymon, Tracy, CA (US)

(73) Assignee: Lam Research Corporation, Fremont, CA (US)

( * ) Notice: Subject to any disclaimer, the term of this patent is extended or adjusted under 35 U.S.C. 154(b) by 519 days.

This patent is subject to a terminal disclaimer.

(21) Appl. No.: 15/447,005

(22) Filed: Mar. 1, 2017

(65) Prior Publication Data
US 2017/0178917 A1    Jun. 22, 2017

Related U.S. Application Data

(62) Division of application No. 14/830,661, filed on Aug. 19, 2015, now Pat. No. 9,620,376.

(51) Int. Cl.
*H01L 21/3065* (2006.01)
*H01J 37/32* (2006.01)
(Continued)

(52) U.S. Cl.
CPC ........ *H01L 21/3065* (2013.01); *H01J 37/321* (2013.01); *H01J 37/3211* (2013.01);
(Continued)

(58) Field of Classification Search
CPC .......... H01L 21/3065; H01L 21/67069; H01L 21/3081; H01L 21/0223; H01L 21/31116;
(Continued)

(56) References Cited

U.S. PATENT DOCUMENTS 5,030,319 A    7/1991 Nishino et al.
5,470,390 A *  11/1995 Nishikawa .............. B01F 3/026
                                                118/715
(Continued)

OTHER PUBLICATIONS

Kanarik et al., "Overview of Atomic Layer Etching in the Semiconductor Industry," J. Vac. Sci. Technol. A, vol. 33, No. 2, Mar./Apr. 2015.
(Continued)

*Primary Examiner* — Jeffrie R Lund
(74) *Attorney, Agent, or Firm* — Weaver Austin Villeneuve & Sampson LLP

(57) ABSTRACT

Methods of and apparatuses for laterally etching semiconductor substrates using an atomic layer etch process involving exposing an oxidized surface of a semiconductor substrate to a fluorine-containing etch gas and heating the substrate to remove non-volatile etch byproducts by a sublimation mechanism are provided herein. Methods also including additionally pulsing a hydrogen-containing gas when pulsing the fluorine-containing etch gas. Apparatuses also include an ammonia mixing manifold suitable for separately preparing and mixing ammonia for use in various tools.

16 Claims, 10 Drawing Sheets

(51) Int. Cl.
*H01L 21/02* (2006.01)
*H01L 21/308* (2006.01)
*H01L 21/311* (2006.01)
*H01L 21/67* (2006.01)

(52) U.S. Cl.
CPC .. *H01J 37/32091* (2013.01); *H01J 37/32449* (2013.01); *H01L 21/0223* (2013.01); *H01L 21/3081* (2013.01); *H01L 21/31116* (2013.01); *H01L 21/67069* (2013.01); *H01J 2237/334* (2013.01); *H01L 21/02238* (2013.01)

(58) Field of Classification Search
CPC ............ H01L 21/02238; H01J 37/3211; H01J 37/32091; H01J 37/321; H01J 37/32449; H01J 2237/334
See application file for complete search history.

(56) References Cited

U.S. PATENT DOCUMENTS

| | | | |
|---|---|---|---|
| 6,333,272 B1* | 12/2001 | McMillin | C23F 4/00 438/710 |
| 6,800,139 B1* | 10/2004 | Shinriki | C23C 16/409 118/715 |
| 6,846,744 B1 | 1/2005 | Chen | |
| 7,416,989 B1 | 8/2008 | Liu | |
| 7,708,859 B2* | 5/2010 | Huang | C23C 16/45561 118/715 |
| 8,728,896 B2 | 5/2014 | Kronholz et al. | |
| 8,916,477 B2 | 12/2014 | Thedjoisworo et al. | |
| 9,006,108 B2 | 4/2015 | Fuller et al. | |
| 9,558,928 B2 | 1/2017 | Thedjoisworo et al. | |
| 2003/0211752 A1 | 11/2003 | Rattner | |
| 2004/0112538 A1* | 6/2004 | Larson | H01L 21/67017 156/345.33 |
| 2004/0112540 A1* | 6/2004 | Larson | G05D 7/0664 156/345.33 |
| 2005/0199342 A1* | 9/2005 | Shajii | C23C 16/45561 156/345.26 |
| 2007/0072388 A1 | 3/2007 | Chen | |
| 2007/0087521 A1 | 4/2007 | Fujita | |
| 2008/0284719 A1 | 11/2008 | Yoshida | |
| 2009/0115029 A1 | 5/2009 | Koyama | |
| 2009/0162261 A1* | 6/2009 | Baera | F28F 7/02 422/186.04 |
| 2009/0179085 A1* | 7/2009 | Carducci | B32B 43/00 239/289 |
| 2009/0218317 A1* | 9/2009 | Belen | C23C 16/45565 216/67 |
| 2011/0005601 A1* | 1/2011 | Shareef | H01L 21/67069 137/1 |
| 2011/0180233 A1* | 7/2011 | Bera | F28F 7/02 165/47 |
| 2011/0183445 A1* | 7/2011 | Hanaoka | H01L 21/02032 438/14 |
| 2012/0070997 A1* | 3/2012 | Larson | C23C 16/45561 438/710 |
| 2012/0193715 A1 | 8/2012 | Engelmann et al. | |
| 2012/0252195 A1* | 10/2012 | Jones | H01J 37/08 438/514 |
| 2013/0037919 A1 | 2/2013 | Sapra | |
| 2015/0183445 A1 | 7/2015 | Hanaoka | |
| 2015/0325415 A1* | 11/2015 | Watanabe | H01J 37/32532 216/67 |
| 2016/0064212 A1 | 3/2016 | Thedjoisworo et al. | |
| 2016/0111258 A1* | 4/2016 | Taskar | H01J 37/32449 156/345.24 |
| 2016/0203995 A1 | 4/2016 | Kanarik et al. | |
| 2016/0133480 A1 | 5/2016 | Ko | |
| 2016/0148813 A1* | 5/2016 | Rogers | H01J 37/3244 438/714 |
| 2016/0181111 A1 | 6/2016 | Kamp et al. | |
| 2016/0211137 A1* | 7/2016 | Tang | H01J 37/3171 |
| 2017/0002306 A1* | 1/2017 | Cecchi | C12M 41/34 |
| 2017/0053808 A1* | 2/2017 | Kamp | H01L 21/3065 |
| 2017/0338075 A1* | 11/2017 | Byl | H01J 27/16 |
| 2018/0023765 A1* | 1/2018 | Sweeney | F17C 13/02 235/492 |
| 2018/0130640 A1* | 5/2018 | Gregor | C23C 16/505 |
| 2018/0149315 A1* | 5/2018 | Despres | H01L 21/67 |

OTHER PUBLICATIONS

Non-Final Rejection, dated Jun. 10, 2016 for U.S. Appl. No. 14/830,661.
Final Rejection, dated Oct. 14, 2016 for U.S. Appl. No. 14/830,661.
Notice of Allowance, dated Feb. 15, 2017, for U.S. Appl. No. 14/830,661.

* cited by examiner

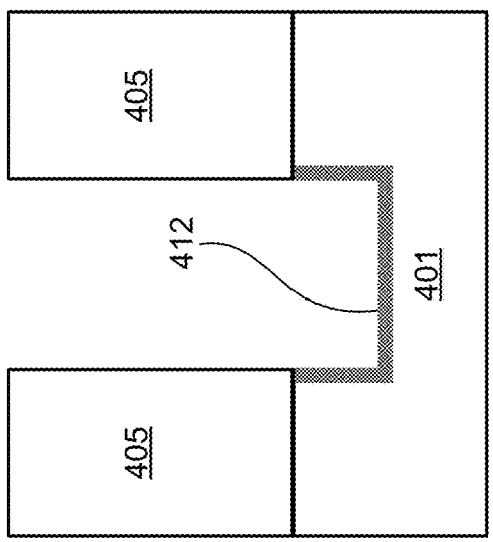
*FIG. 4A*
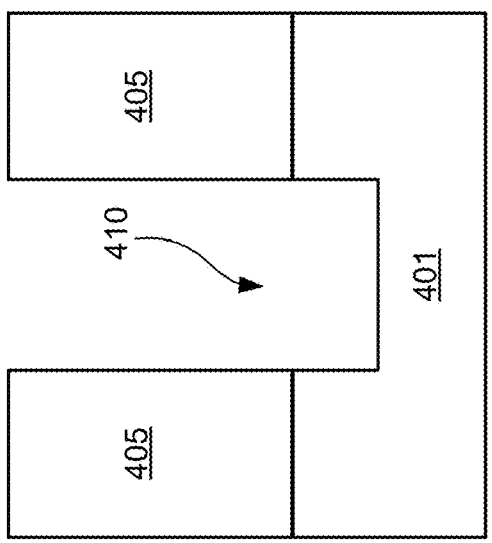
*FIG. 4B*
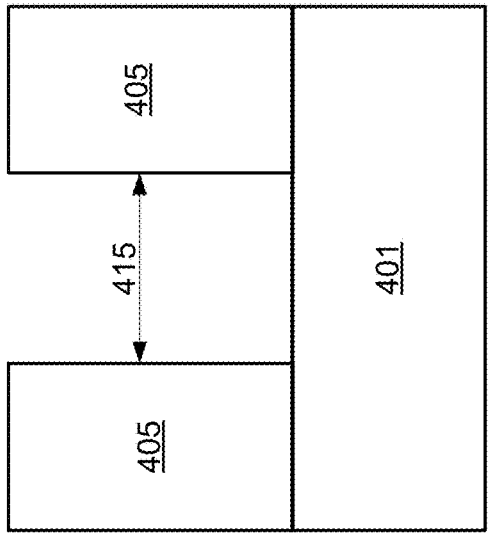
*FIG. 4C*
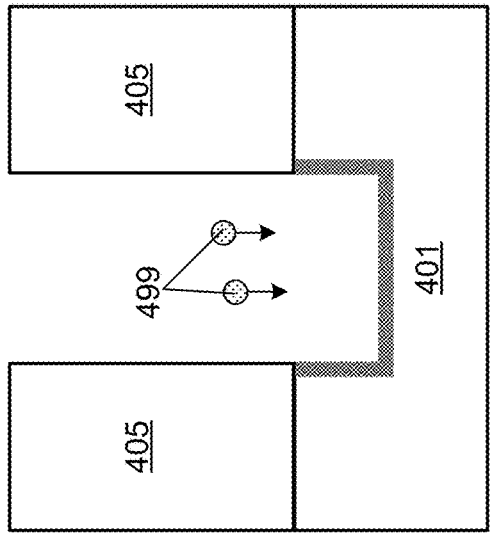
*FIG. 4D*
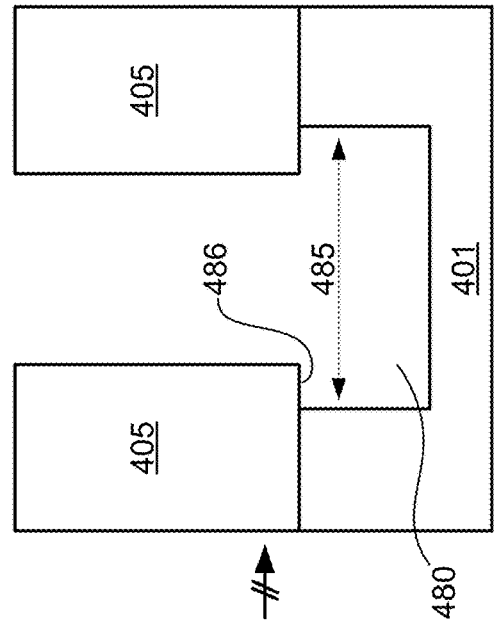
*FIG. 4E*
*FIG. 4F*

SELF LIMITING LATERAL ATOMIC LAYER ETCH

CROSS-REFERENCE TO RELATED APPLICATIONS

This application is a divisional of U.S. patent application Ser. No. 14/830,661, filed Aug. 19, 2015, now allowed.

BACKGROUND

Etch processes in semiconductor processes often include etching semiconductor material to form features, such as vias and trenches. For example, trenches may be etched to help form a transistor gate.

SUMMARY

Provided herein are methods of etching substrates. One aspect involves a method of etching a substrate including a semiconductor material, the method including: exposing the substrate to a fluorine-containing gas to etch an oxidized surface of the substrate in a self-limiting reaction selective to non-oxidized semiconductor material, and heating the substrate to remove non-volatile solid etch byproducts by sublimation.

In various embodiments, the substrate is etched laterally. In various embodiments, the substrate is heated to a temperature between about 60° C. and about 300° C. to remove the non-volatile solid etch byproducts.

In various embodiments, the substrate further includes a patterned hard mask deposited over the semiconductor material. The hard mask may include nitride. In some embodiments, the hard mask may include carbon.

In some embodiments, the method includes, prior to exposing the substrate to the fluorine-containing gas, exposing the substrate to an oxidant to oxidize a surface of the semiconductor material to form the oxidized surface. The semiconductor layer may be exposed to the oxidant at a temperature between about −60° C. and about 250° C. The semiconductor layer may be exposed to the oxidant for a duration between about 0 min and about 10 min. The substrate may be processed without breaking vacuum. In various embodiments, the method also includes alternating between exposing the substrate to the oxidant and the fluorine-containing gas in cycles. The method may also include purging after exposing the substrate to the oxidant.

The oxidant may be any of the following gases: oxygen, ozone, silicon oxide, carbon monoxide, carbon dioxide, or nitrous oxide. The semiconductor layer may be exposed to the oxidant at a chamber pressure less than about 10 Torr.

The oxidant may be a plasma generated from any of the following gases: oxygen, ozone, silicon oxide, carbon monoxide, carbon dioxide, or nitrous oxide. Where the oxidant is a plasma, the semiconductor layer may be exposed to the oxidant at a chamber pressure between about 5 mTorr and about 400 mTorr.

In some embodiments, the method also includes exposing the oxidized layer to a hydrogen-containing gas during the exposing of the substrate to a fluorine-containing gas. In some embodiments, the flow rate ratio of the fluorine-containing gas to the hydrogen-containing gas is between about 1:1 and 10:1.

In various embodiments, the fluorine-containing gas is nitrogen trifluoride or sulfur trifluoride. In some embodiments, the method also includes flowing a carrier gas selected from the group consisting of ammonia, argon, and helium.

In some embodiments, the oxidized layer is selectively etched when a chuck holding the substrate is set at a temperature between about −60° C. and about 100° C. In some embodiments, the oxidized layer is selectively etched at a chamber pressure between about 10 mTorr and 1 Torr.

In some embodiments, the method includes purging after exposing the substrate to the fluorine-containing gas.

Another aspect may involve an apparatus for processing a substrate, the apparatus including: (a) one or more process chambers, each process chamber including a chuck; (b) one or more gas inlets into the one or more process chambers and associated flow-control hardware; (c) a mixing manifold for mixing ammonia separately from other process gases; (d) a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware by: (i) flowing a fluorine-containing etchant to one of the one or more process chambers housing a substrate to selectively etch an oxidized layer; and (ii) heating the substrate to remove non-volatile solid etch byproducts by sublimation.

The mixing manifold may be cleanable. In some embodiments, ammonia mixed in the mixing manifold is flowed to one of the one or more process chambers via the one or more gas inlets, and one of the one or more gas inlets introduces gas from the side of the one of the one or more process chambers.

In various embodiments, the ammonia mixed in the mixing manifold is flowed to one of the one or more process chambers via the one or more gas inlets, and one of the one or more gas inlets introduces gas from the top of the one of the one or more process chambers.

In various embodiments, the memory further includes instructions for flowing ammonia from the mixing manifold to one of the one or more process chambers when the fluorine-containing etchant is flowed.

In some embodiments, memory further includes instructions for repeating (i) and (ii). In some embodiments, the memory further includes instructions for (iii) flowing an oxidant to one of the one or more process chambers to oxidize a semiconductor layer of the substrate. In various embodiments, memory further includes instructions for purging the one of the one or more process chamber after exposing the substrate to the fluorine-containing gas.

In various embodiments, the memory further includes instructions for flowing a hydrogen-containing gas during the exposing of the substrate to a fluorine-containing gas.

In various embodiments, the one of the one or more process chambers is set at a chamber pressure less than about 10 Torr.

In various embodiments, the apparatus also includes a plasma generator, whereby the memory further includes igniting a plasma during (iii). In some embodiments, the one of the one or more process chambers is set at a chamber pressure between about 5 mTorr and about 400 mTorr.

These and other aspects are described further below with reference to the drawings.

BRIEF DESCRIPTION OF THE DRAWINGS

FIGS. 4A-4F are schematic illustrations of a substrate undergoing operations of disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1A:
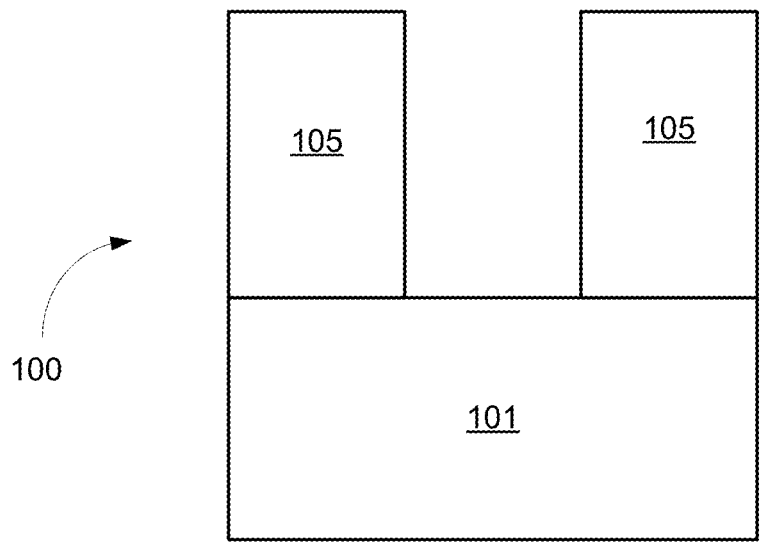
FIGS. 1A and 1B are schematic depictions of substrates.
Figure 1B:
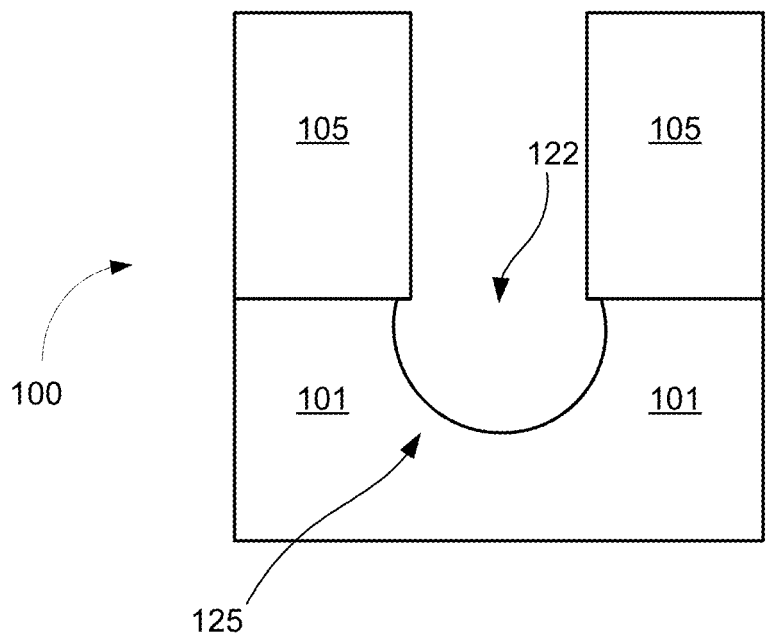

Semiconductor fabrication processes involves etching of semiconductor material, such as silicon. For example, trenches may be etched prior to depositing or etching other materials on a substrate to form a transistor gate. Conventional methods of etching semiconductor materials include exposing the semiconductor material to etching species and igniting a plasma or applying a bias. Some methods are limited to a vertical-only etch, such as when a bias is applied and the etching species are directionally sputtered toward the surface of the semiconductor material to etch it. However, some of these methods result in undesirable results, such as bowling or curving of edges of the etched trenches. An example is provided in FIGS. 1A and 1B. FIG. 1A depicts a substrate 100 with a silicon layer 101 and a patterned hard mask 105 over the silicon layer. In FIG. 1B, the silicon layer 101 has been etched to form a trench 122, but the trench has bowled or curved edges 125, due to the difference in etch rate throughout the trench. In some conventional processes, the middle of the trench etches more quickly than the top or sides of the trench, and corners are difficult to etch completely. As a result, trenches do not have a shape with linear edges.

Another undesirable result may be re-deposition of etched materials onto sidewalls or other components of the substrate. This may cause a 3-D feature profile to have loading problems. Some methods also result in non-uniformly etched features for substrates having various feature sizes, thereby resulting in a pattern loading problem. As a result, non-uniformly etched substrates potentially cause additional problems in subsequent fabrication processes. Additionally, apparatuses typically used to perform such etch processes sometimes involve flowing ammonia gas, which may cause formation of ammonium salts in the gas lines or gas box where the process gases are mixed, thereby destroying components of the apparatus.

Provided herein are methods of etching substrates using a self-limiting etch. In various embodiments, atomic layer etch (ALE) is used to etch substrates. Various embodiments involve oxidation combined with an ion-less oxide etch. This cycled two-step process etches in monolayer increments, resulting in a uniformly etched trench or feature and can be used to etch laterally. Methods are independent of feature size, shape, or 3-D aspects of the substrate because there is little to no re-deposition and each cycle is a self-limiting reaction such that the top, middle, and bottom of a trench etches at the same monolayer depth, thereby not altering the profile even during lateral etch. Disclosed embodiments may be used to fabricate source-drain regions of a transistor.

The concept of an "ALE cycle" is relevant to the discussion of various embodiments herein. Generally an ALE cycle is the minimum set of operations used to perform an etch process one time, such as etching a monolayer. For example, disclosed methods may involve exposing a substrate to alternating pulses of two reactants—one to modify or oxidize the surface and one to remove the modified or oxidized surface in layer by layer etching. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal or etch gas and an optional plasma, and (iv) purging of the chamber/removal of etch products from chamber.

Figure 2:
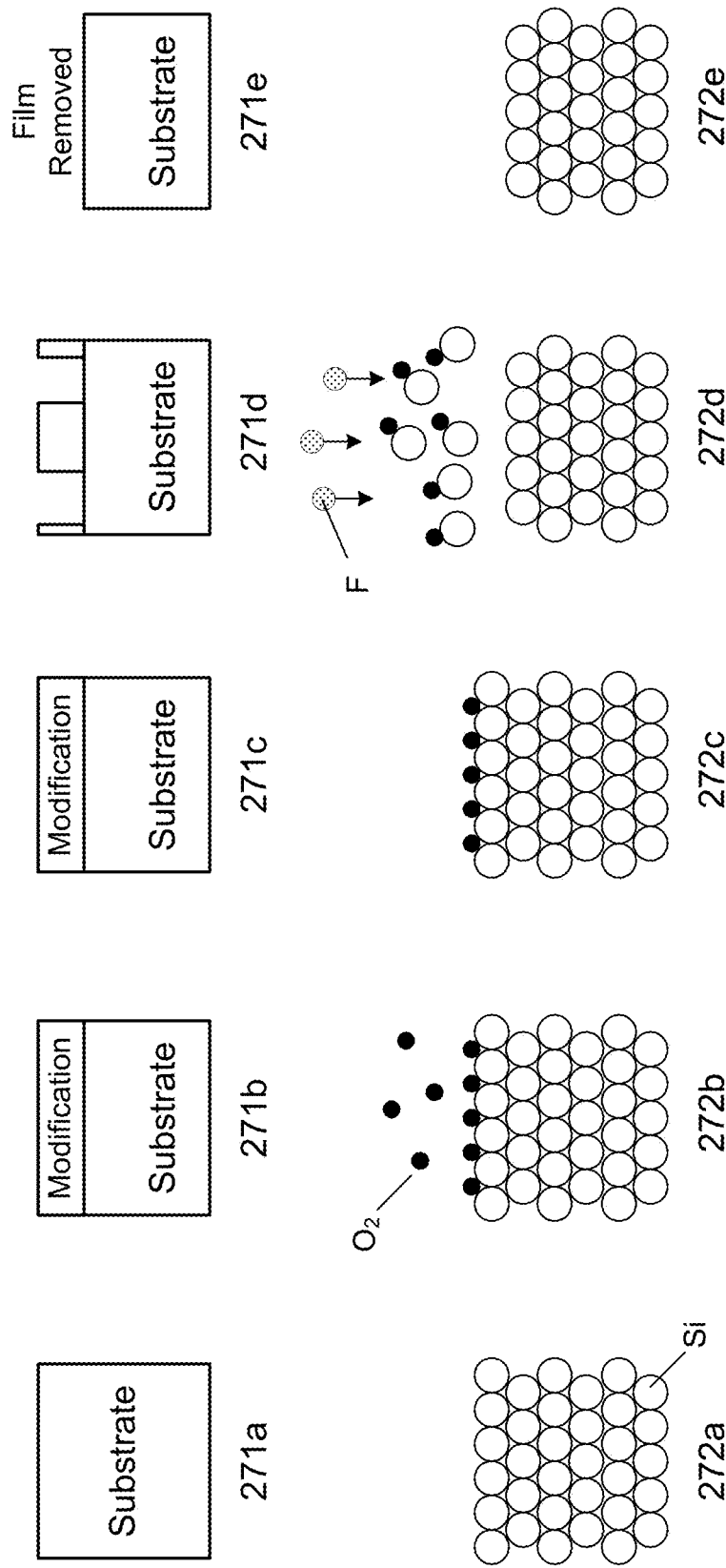
FIG. 2 is a schematic illustration of an example of an etching scheme.

FIG. 2 shows two example schematic illustrations of an ALE cycle. Diagrams 271a-271e show a generic ALE cycle. In 271a, the substrate is provided. In 271b, the surface of the substrate is modified. In 271c, the next step is prepared. In 271d, the modified layer is being etched. In 271e, the modified layer is removed. Similarly, diagrams 272a-272e show an example of an ALE cycle for etching a silicon film. In 272a, a silicon substrate is provided, which includes many silicon atoms. In 272b, reactant gas oxygen is introduced to the substrate which modifies the surface of the substrate. The schematic in 272b shows that some oxygen is adsorbed onto the surface of the substrate as an example. Although oxygen is depicted in FIG. 2, any oxidant may be used and in some embodiments, a plasma may be used. In 272c, the reactant gas oxygen is purged from the chamber. In 272d, a etch gas including fluorine is introduced as indicated by the fluorine and arrows to remove the modified surface of the substrate. During this operation, a bias is optionally applied to the substrate to attract ions toward it. In various embodiments, however, a bias is not applied and the substrate is etched uniformly. Etch during this operation may be highly selective. In 272e, etch byproducts are removed. This may involve purging the chamber.

Figure 3:
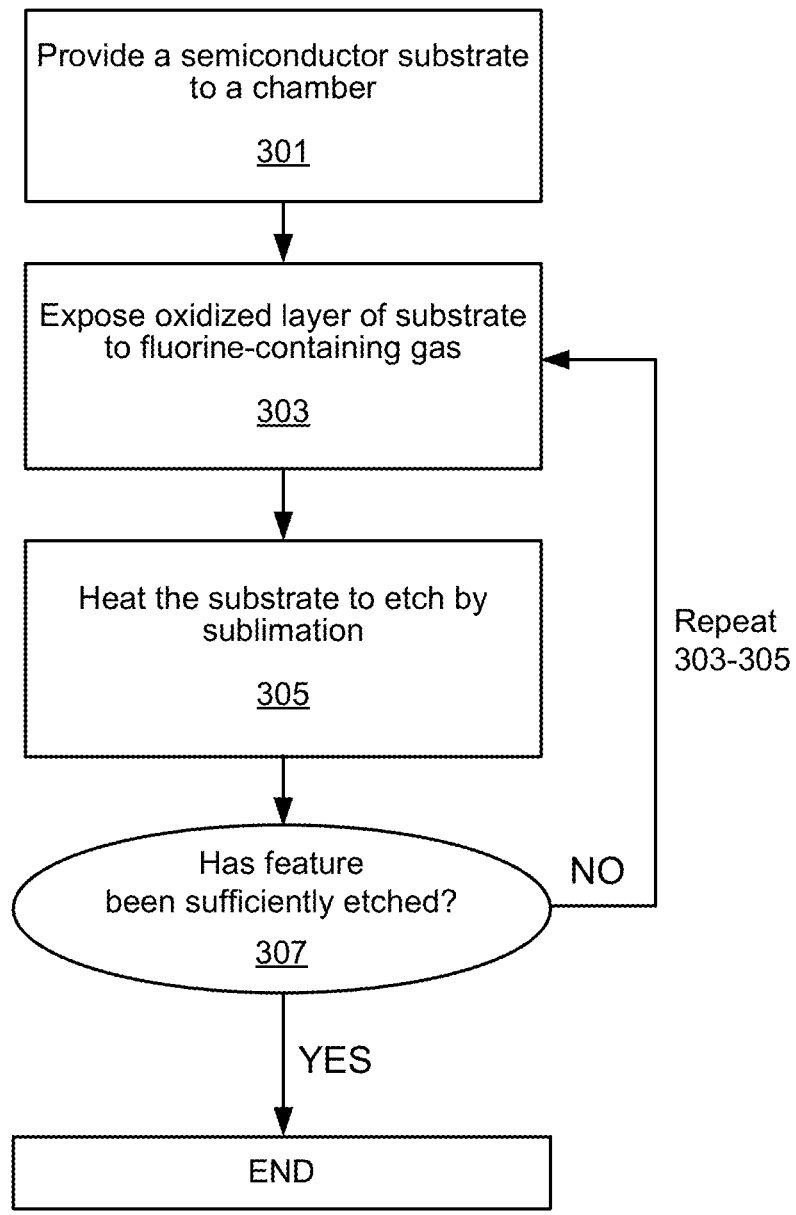
FIG. 3 is a process flow diagram depicting operations performed in accordance with disclosed embodiments.

FIG. 3 is a process flow diagram depicting operations performed in accordance with disclosed embodiments. In operation 301, a semiconductor substrate is provided to a chamber. The substrate may be a silicon wafer, e.g., a 200-mm wafer, a 300-mm wafer, or a 450-mm wafer, including wafers having one or more layers of material such as dielectric, conducting, or semi-conducting material deposited thereon. In some embodiments, a silicon-containing material or a germanium-containing layer may be on the substrate to be etched. For example, the substrate may include amorphous silicon, poly-silicon, crystalline silicon, or combinations thereof. The substrate may include other layers as well, such as hard masks and spacers. The mask may include carbon or nitrides. The mask may be patterned to protect surfaces of silicon that are not to be etched from being exposed to subsequent etch chemistry. In some embodiments, a spacer is not present on the substrate.

FIG. 4A provides an example schematic diagram of a substrate with a silicon layer 401 and a patterned hard mask 405. The patterned hard mask 405 includes an opening having a width 415.

In various embodiments, the substrate in operation 301 is patterned. A patterned substrate may have "features" such as vias or contact holes, which may be characterized by one or more of narrow and/or re-entrant openings, constrictions within the features, and high aspect ratios. The features may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In some embodiments, the substrate may include partially etched features or trenches.

A patterned substrate may be patterned by etching the substrate. For example, in some embodiments, a silicon substrate may be etched vertically, while the hard mask protects portions of the substrate from being exposed to the etch chemistry. For example, the substrate may be exposed to conventional etch chemistries to directionally etch the semiconductor material. Example chemicals include combinations of fluorine-containing gases and other process gases, such as a combination of nitrogen trifluoride ($NF_3$) and chlorine ($Cl_2$), or a combination of $NF_3$ with hydrogen ($H_2$), or sulfur hexafluoride ($SF_6$). In some embodiments, the substrate is exposed at a temperature between about −60° C. and about 200° C. at a chamber pressure between about 1 mTorr and about 100 mTorr to vertically etch the substrate. FIG. 4B provides a further example of the substrate in 4A being vertically etched to form trench 410.

In operation 303, an oxidized layer is exposed to a fluorine-containing gas to etch the oxidized layer. The layer may be oxidized by exposing the substrate to an oxidant. For example, substrate is exposed to an oxidant to modify a surface of the substrate and thereby oxidize a layer of the surface of the substrate. In some embodiments, the oxidant may be an oxidizing source in the chamber, such as a chamber component.

The oxidant may be any electronegative oxidizing gas or plasma, or any oxygen-containing gas or plasma. Examples include oxygen gas, oxygen plasma (e.g., ionized oxygen), and ozone. The following example gases may be used with or without a plasma: silicon dioxide ($SiO_2$), carbon monoxide (CO), carbon dioxide ($CO_2$), and nitrous oxide (NO). Any combination of oxidants may be used in this operation. In some embodiments, a carrier gas may be flowed, such as an inert gas.

Oxidation may be performed at a temperature between about −60° C. and about 250° C., depending on the tool. A higher temperature used in operation 303 may result in a faster etch process but does not affect the amount of oxidation or the depth of oxidation in operation 303. Where a plasma is not used, operation 303 may be performed at a pressure up to about 10 Torr. Where a plasma is used, operation 303 may be performed at a chamber pressure between about 5 mTorr and about 400 mTorr. The power of a TCP plasma may be between about 100 W and 1000 W.

During oxidation, about 1 to about 10 monolayers of the substrate are typically oxidized. In various embodiments, oxidation is self-limited. That is, beyond a certain duration, there is a threshold maximum whereby all or most of all exposed surfaces of a semiconductor layer is saturated with oxygen and oxidized. For example, in some embodiments, at least 80%, or at least 90%, or at least 95% of exposed surfaces are oxidized. In some embodiments, oxidation only occurs in one monolayer, but in some embodiments, a few monolayers may be oxidized in one exposure.

The substrate may be exposed to the oxidant for a duration less than about 10 minutes. Note that in various embodiments, if the mask is a nitride mask, exposure to an oxidant may cause the nitride mask to also be oxidized. Accordingly, the amount of exposure (including flow rates and duration) may be modulated to limit oxidation on the nitride mask and prevent mask depletion. FIG. 4C shows an example of a substrate 401 with an oxidized layer 412. Note that this operation may be performed for a duration sufficient to saturate most of or all of the exposed substrate surface, as shown in FIG. 4C.

In some embodiments, a purge may be performed after an oxidation operation. In a purge operation, non-surface-bound active fluorine-containing species may be removed from the process chamber. This can be done by purging and/or evacuating the process chamber to remove the etchant, without removing the adsorbed layer. The species generated in a fluorine plasma can be removed by stopping the plasma and allowing the remaining species to decay, optionally combined with purging and/or evacuation of the chamber. Purging can be done using any inert gas such as $N_2$, Ar, Ne, He and their combinations.

Operation 303 involves etching an oxidized layer. In various embodiments, this removal operation involves a dry etch. The oxidized layer is removed by exposing the substrate to a fluorine-containing etch gas and a hydrogen-containing gas. These gases may be activated using an in situ plasma. Examples of fluorine-containing gases include nitrogen trifluoride ($NF_3$) and sulfur hexafluoride ($SF_6$). In some embodiments, a carrier gas is also flowed during operation 303. Example carrier gases include nitrogen ($N_2$), argon (Ar), and helium (He). In some embodiments, helium may aid in dissociation of etch gases, if a plasma is activated. The flow rate ratio of carrier gas to etch gas may be between about 1:1 and about 50:1. In some embodiments, etch during operation 303 may be selective, such that the oxidized layer is removed selective to the rest of the silicon substrate. In some embodiments, a combination of a fluorine-containing etch gas and a hydrogen-containing gas may improve selectivity. An example combination of gases may be $H_2$ and $NF_3$. Another example of a combination of gases may be $NH_3$ and $NF_3$.

In various embodiments where $NH_3$ is used as a carrier gas or a process gas, $NH_3$ may be delivered to a chamber where the substrate is housed via an inlet at the top of the chamber such that $NH_3$ flows directly onto the top surface of the substrate in an approximately perpendicular direction from the surface of the substrate, or via an inlet at a side of the chamber, such that $NH_3$ flows from an edge of the substrate to another edge and flows over the surface of the substrate such that flow is approximately parallel to the surface of the substrate. In some embodiments, flow to the chamber may be switched between flowing in from the top and flowing in from an edge. In disclosed embodiments, $NH_3$ may be flowed and mixed in a separate mixing manifold from other process gases, thereby reducing risk of destroying a gas box including other process gases. For example, as described further below, a mixing manifold for ammonia reduces formation of ammonium salts in gas lines and prevents damage in the gas box and other mixers. In some embodiments, $NH_3$ may also be ionized, such that $NH_3$ is ionized and mixed away from the wafer, thereby reducing the presence of ions on the wafer during removal to allow an ion-less oxide etch. A mixing manifold for $NH_3$ may be integrated with other tools, as further described below.

Etching during operation 303 may be performed at a pressure between about 10 mTorr and about 1 Torr. The substrate temperature, or the temperature of the surface on which the substrate sits, may be low or high depending on the tool or apparatus. The duration of exposure to the fluorine-containing etch gas may depend on the temperature. For example, if exposure to the fluorine-containing etch gas is performed at a low temperature, such as between about −60° C. and about 100° C., or such as about 0° C., the substrate may be exposed to the etch gas for a few minutes, such as between about 5 and about 10 minutes. In some embodiments, where exposure to the fluorine-containing etch gas is performed at a high temperature, such as greater than about 100° C., for example about 120° C., the substrate may be exposed to the etch gas for a duration between about 10 seconds and about 300 seconds, or between about 15 and about 120 seconds, for example for a duration greater than about 30 seconds.

In various embodiments, removal of the oxidized layer may be conformal and lateral. In some embodiments, disclosed embodiments are capable of performing lateral etch. Note, however, that in some embodiments, some removal operations may not be conformal, or etching may not be lateral. For example, in some embodiments, a bias may be applied during operation 305 to directionally etch vertically into the trench. In some embodiments, a low bias may be applied during operation 303 to directionally saturate the bottom of the trench.

Oxidation and etch may be performed without breaking vacuum. In some embodiments, the operations are performed in the same chamber, or in the same tool but in different stations or chambers.

In various embodiments, operation 303 removes most or all the oxidized layer, thereby etching uniformly throughout the trench. FIG. 4D shows an example of a fluorine-containing etch gas 499 used to etch the oxidized layer 412. As shown in FIG. 4E, after the oxidized layer is removed, the trench 420 is etched uniformly, and may be etched laterally, such that the width 425 is greater than the width 415 between the hard masks 405 as shown in FIG. 4A. The lateral etch may etch under the hard mask in these monolayer or near monolayer increments, as shown at 426.

Returning to FIG. 3, in operation 305, the substrate is heated to remove non-volatile solid reaction byproducts of operation 303 by a sublimation mechanism. Sublimation may occur in situ by heating the substrate to temperatures between about 60° C. and about 300° C., or between about 70° C. and about 250° C. In some embodiments, the temperature of the substrate in operation 305 is at least between about 20° C. to about 100° C. higher than the temperature of the substrate in operation 303. The duration of sublimation may range from about 5 s to about 600 s, depending on sublimation temperature. The duration may be the duration at which the substrate temperature is at the temperature for the sublimation operation. Between operations 303 and 305, the temperature may take about 1 minute to be raised to the temperature for sublimation.

Chamber pressure during sublimation may be between about 0 mTorr and about 20 mTorr. During sublimation, a carrier gas such as nitrogen, argon, or helium, may be flowed to assist in sweeping away sublimating byproducts. Sublimation may also include flowing fluorine- and hydrogen-containing gases, and may include activating a plasma. In some embodiments, sublimation is performed after exposing the substrate to the fluorine-containing etch gas and may be performed as an optional purge operation, described further below.

As described above, gases may be purged from the chamber between operations, or may also be purged after oxidation in operation 303. In some embodiments, the chamber is not purged between exposures. In various embodiments, a purge gas may be used. In some embodiments, the purge gas may have the same as or similar chemistry to carrier gases used in one or more operations described herein. The purge gas may be an inert gas used to remove excess non-adsorbed oxidant after exposing to an oxidant, or may be used to purge etch byproducts in operation 305. In some embodiments, the chamber may be evacuated.

Referring to FIG. 3, in operation 307, it is determined whether the feature or trench has been sufficiently etched. If yes, then the etching process may be completed. If not, operations 303 and 305 may be repeated until the desired trench pattern is etched. Oxidation may also be repeated before operation 303 in repeated cycles. The number of cycles selected for a particular process depends on the target dimension. As shown in FIG. 4F, after two or more cycles of operations 303 and 305, the trench 480 may be etched laterally, resulting in a width 485 that undercuts the hard masks 405 as shown at 486.

In some embodiments, a substrate may be etched until between about 2 nm and about 20 nm of the substrate is etched; for example, in some embodiments, about 2 nm to about 10 nm of a substrate may be etched. In some embodiments, the undercut (shown as 486 in FIG. 4F) may be between about 2 and about 5 nm. In one example, the width of a trench, which may be defined as the distance between sidewalls in a trench, may be etched to a width between about 10 nm and about 100 nm, such as about 20 nm. In some embodiments, the depth, which may be defined as the distance between the field surface of the substrate prior to any etch and the bottom of the trench after the trench is etched, may be between about 30 nm and about 100 nm, such as about 50 nm. In some embodiments, a trench etched using disclosed embodiments may have an aspect ratio between about 1:1 and about 20:1, or between about 2:1 and about 4:1, such as about 3:1. These aspect ratios may be defined as the aspect ratio as determined by the height of the hard mask and the width between the hard masks.

Apparatus

Inductively coupled plasma (ICP) reactors which, in certain embodiments, may be suitable for atomic layer etching (ALE) operations and atomic layer deposition (ALD) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 5A:
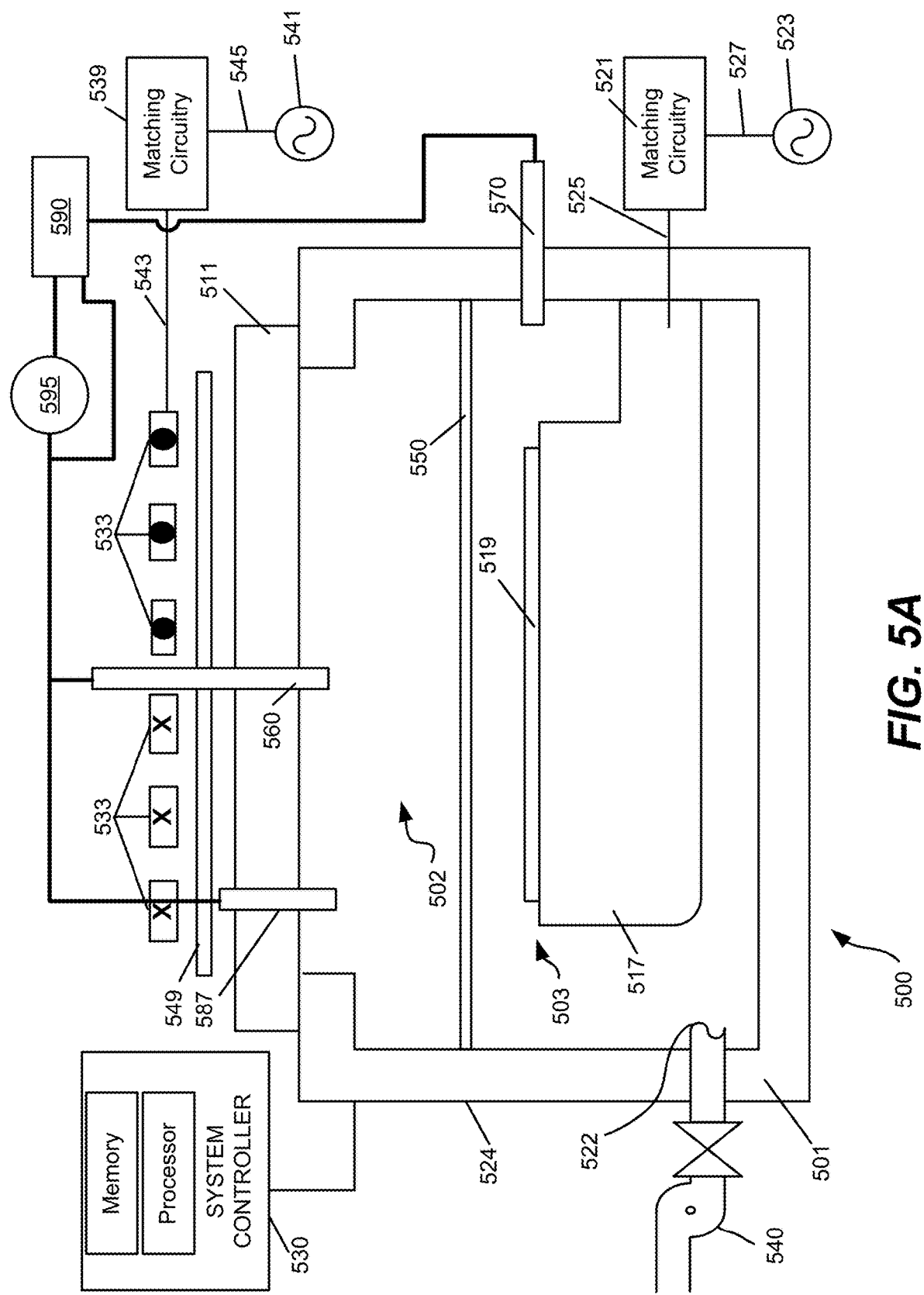
FIG. 5A is a schematic diagram of an example process chamber for performing disclosed embodiments.

FIG. 5A schematically shows a cross-sectional view of an inductively coupled plasma integrated etching and deposition apparatus 500 appropriate for implementing certain embodiments herein, an example of which is a Kiyo® reactor, produced by Lam Research Corp. of Fremont, Calif. The inductively coupled plasma apparatus 500 includes an overall process chamber 524 structurally defined by chamber walls 501 and a window 511. The chamber walls 501 may be fabricated from stainless steel or aluminum. The window 511 may be fabricated from quartz or other dielectric material. An optional internal plasma grid 550 divides the overall process chamber 524 into an upper sub-chamber 502 and a lower sub-chamber 503. In most embodiments, plasma grid 550 may be removed, thereby utilizing a chamber space made of sub-chambers 502 and 503. A chuck 517 is positioned within the lower sub-chamber 503 near the bottom inner surface. The chuck 517 is configured to receive and hold a semiconductor substrate or wafer 519 upon which the etching and deposition processes are performed. The chuck 517 can be an electrostatic chuck for supporting the wafer 519 when present. In some embodiments, an edge ring (not shown) surrounds chuck 517, and has an upper surface that is approximately planar with a top surface of the wafer 519, when present over chuck 517. The chuck 517 also includes electrostatic electrodes for chucking and dechucking the wafer 519. A filter and DC clamp power supply (not shown) may be provided for this purpose. Other control systems for lifting the wafer 519 off the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517.

Elements for plasma generation include a coil 533 positioned above window 511. In some embodiments, a coil is not used in disclosed embodiments. The coil 533 is fabricated from an electrically conductive material and includes at least one complete turn. The example of a coil 533 shown in FIG. 5A includes three turns. The cross-sections of coil 533 are shown with symbols, and coils having an "X" extend rotationally into the page, while coils having a "●" extend rotationally out of the page. Elements for plasma generation also include an RF power supply 541 configured to supply RF power to the coil 533. In general, the RF power supply 541 is connected to matching circuitry 539 through a connection 545. The matching circuitry 539 is connected to the coil 533 through a connection 543. In this manner, the RF power supply 541 is connected to the coil 533. An optional Faraday shield 549 is positioned between the coil 533 and the window 511. The Faraday shield 549 is maintained in a spaced apart relationship relative to the coil 533. The Faraday shield 549 is disposed immediately above the window 511. The coil 533, the Faraday shield 549, and the window 511 are each configured to be substantially parallel to one another. The Faraday shield 549 may prevent metal or other species from depositing on the window 511 of the process chamber 524.

Process gases (e.g. metal precursors such as oxidants, fluorine-containing etch gases, carrier gases, ammonia, argon, etc.) may be flowed into the process chamber through one or more top inlets 560 positioned in the upper sub-chamber 502 and/or through one or more side inlets 570. Likewise, though not explicitly shown, similar gas flow inlets may be used to supply process gases to a capacitively coupled plasma processing chamber. A vacuum pump 540, e.g., a one or two stage mechanical dry pump and/or turbomolecular pump, may be used to draw process gases out of the process chamber 524 and to maintain a pressure within the process chamber 524. For example, the vacuum pump 540 may be used to evacuate the lower sub-chamber 503 during a purge operation of ALD or ALE. A valve-controlled conduit may be used to fluidically connect the vacuum pump to the process chamber 524 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 500, one or more process gases may be supplied through the gas flow inlets 560 and/or 570. In certain embodiments, process gas may be supplied only through the gas inlet 560, or only through the side gas flow inlet 570. In some cases, the gas flow inlets shown in the figure may be replaced by more complex gas flow inlets, one or more showerheads, for example. The Faraday shield 549 and/or optional grid 550 may include internal channels and holes that allow delivery of process gases to the process chamber 524. Either or both of Faraday shield 549 and optional grid 550 may serve as a showerhead for delivery of process gases. In some embodiments, a liquid vaporization and delivery system may be situated upstream of the process chamber 524, such that once a liquid reactant or precursor is vaporized, the vaporized reactant or precursor is introduced into the process chamber 524 via a gas flow inlet 560 and/or 570.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The physical and chemical interactions of various generated ions and radicals with the wafer 519 etch features on layers on the wafer 519.

If the plasma grid 550 is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the amount of hot electrons in the lower sub-chamber 503. In some embodiments, the apparatus 500 is designed and operated such that the plasma present in the lower sub-chamber 503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 503 through port 522. The chuck 517 disclosed herein may operate at elevated temperatures ranging between about −60° C. and about 250° C. The temperature will depend on the process operation and specific recipe.

Apparatus 500 may be coupled to facilities (not shown) when installed in a clean room or a fabrication facility. Facilities include plumbing that provide processing gases, vacuum, temperature control, and environmental particle control. These facilities are coupled to apparatus 500, when installed in the target fabrication facility. Additionally, apparatus 500 may be coupled to a transfer chamber that allows robotics to transfer semiconductor wafers into and out of apparatus 500 using typical automation.

In some embodiments, a system controller 530 (which may include one or more physical or logical controllers) controls some or all of the operations of a process chamber 524. The system controller 530 may include one or more memory devices and one or more processors as shown in FIG. 5A. For example, the memory may include instructions to flow an oxidant such as oxygen and instructions to flow an etch gas such as a fluorine-containing gas, or instructions to ignite a plasma or apply a bias, or instructions to increase the temperature of the chuck 517 holding the substrate to heat the substrate and remove etch byproducts by sublimation. In some embodiments, the apparatus 500 includes a switching system for controlling flow rates and durations when disclosed embodiments are performed. In some embodiments, the apparatus 500 may have a switching time of up to about 500 ms, or up to about 750 ms. Switching time may depend on the flow chemistry, recipe chosen, reactor architecture, and other factors.

In some implementations, the system controller 530 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 530, which may control various components or subparts of the system or systems. The system controller 530, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 530 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 530 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 5B:
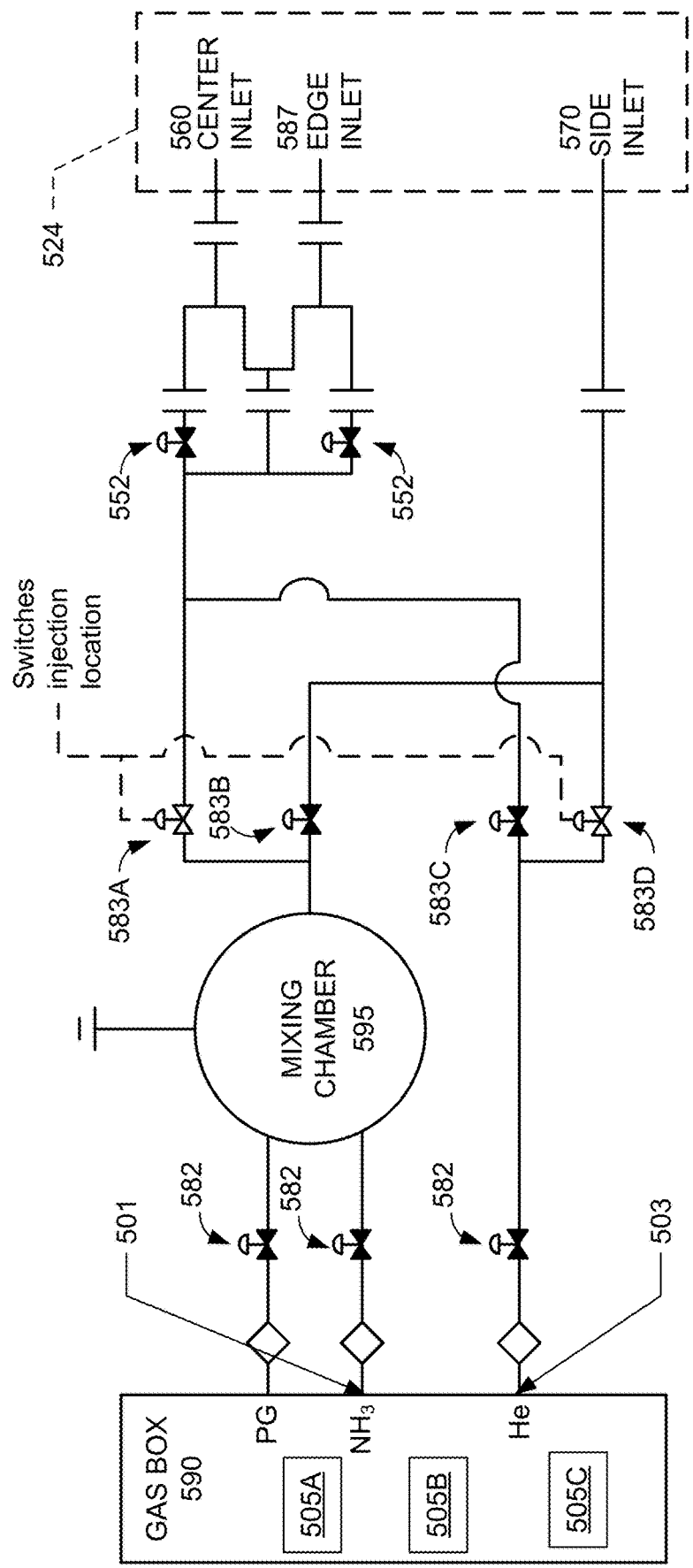
FIG. 5B is a schematic diagram of flow control to a chamber using disclosed embodiments.

FIG. 5B is a schematic diagram of an example mixing apparatus suitable for use in accordance with disclosed embodiments. The apparatus includes a gas box 590 (also seen in FIG. 5A), which may include sources and conduits of gases such as a purge gas (indicated as PG), $NH_3$, and helium. A gas sources 505A, 505B, and 505C are representationally shown in FIG. 5B and it is understood that the gas box 590 may include, or may be connected to, multiple gas sources such as oxidants, fluorine containing gases, etc. The gas box also includes a first outlet 501, corresponding to the ammonia process gas source, and a second outlet 503 corresponding to the helium gas source. Valves 582 are used to modulate the flow of the purge gas, $NH_3$, and helium gas from the gas box 590. The apparatus also includes a mixing manifold or chamber 595 suitable for mixing $NH_3$ with other gases. This mixing chamber 595 is near the process chamber 524 shown as a dotted box and not in the gas box 590. This protects the gas box 590 from any ammonium salts that could be formed from mixing $NH_3$ with halogen gases. The flow from mixing manifold 595 is modulated by a set of parallel valves 583A, 583B, 583C, and 583D used to switch the injection location of the gases from the wafer center (gas inlet 560) to wafer edges (gas inlet 587) or through the side inlet (gas inlet 570). Chamber side gas inlet 570 may be used for various applications to begin the ionization outside the wafer edges. The fluid connection between the gas box 590, the mixing chamber 595 and the gas inlets 560, 587, and 570 is also representationally illustrated in FIG. 5A, although additional piping and valving is seen in FIG. 5B.

As also seen in FIG. 5B, the mixing chamber 595 is fluidly connected to the first outlet 501, fluidly connected with plurality of top inlets (560 and 587) and the side inlet 570, and fluidly interposed between the first outlet 501, and the plurality of top inlets (560 and 587) and the side inlet 570. In this depicted configuration, gas is configured to flow from the first outlet 501, through the mixing chamber 595, and to either the plurality of top inlets (560 and 587) or the side inlet 570. Gas is also configured to flow from the second outlet 503 to the plurality of top inlets (560 and 587) and the side inlet 570 without flowing through the mixing chamber 595. A first set of parallel valves 583A and 583B are fluidly interposed between the mixing chamber 595 and the plurality of top inlets (560 and 587) and the side inlet 570, and are configured to control the flow of gas between the mixing chamber 595 and the plurality of top inlets (560 and 587) and the side inlet 570. Valves 552 are used to control gas flow between the top inlets, including the center inlet 560 and the edge inlet 587. A second set of parallel valves 583C and 583D are fluidly interposed between the second outlet 503, and the plurality of top inlets (560 and 587) and the side inlet 570, and configured to control the flow of gas between the second outlet 503 and the plurality of top inlets (560 and 587) and the side inlet 570.

Figure 5C:
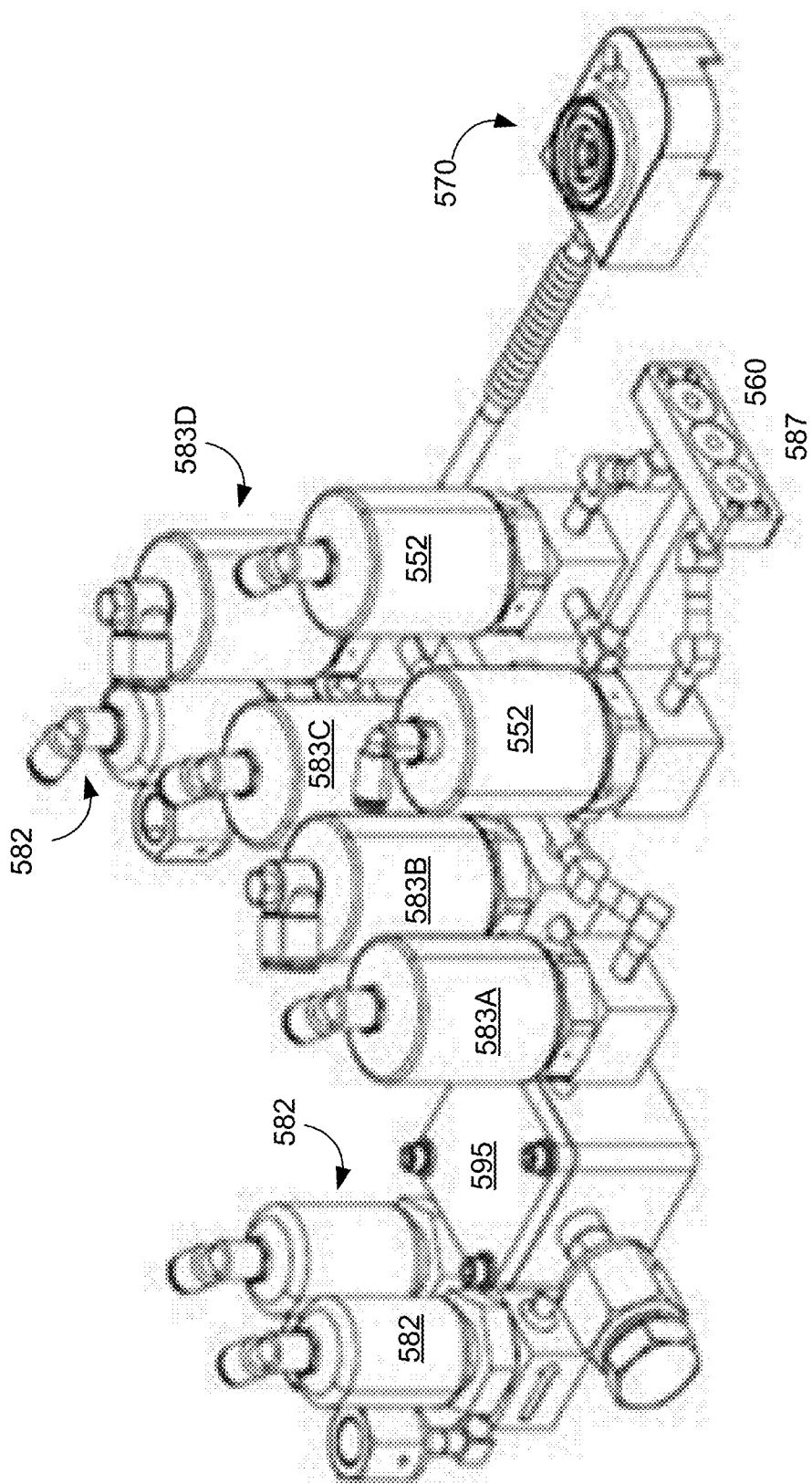
FIG. 5C is a schematic drawing of flow control hardware in accordance with disclosed embodiments.

FIG. 5C depicts an illustration of an example of an apparatus including a mixing manifold 595 suitable for preparing and delivering $NH_3$ in certain embodiments. Valves 583A and 583B are used to modulate the flow of gases, such as $NH_3$, from the mixing manifold 595 and valves 583C and 583D are used to module the flow of gases from the gas box second outlet (not shown). Valves 552 are seen which modulate gas flow between the center inlet 560 and the edge inlet 587. Valves 582 are also shown which modulate gas flow out of the gas box as described above. Mating joints identified as the top inlets 560 and 587, and the side inlet 570, are on the body of the apparatus, which may further include other mixing chambers (not shown) and be connected to one or more process chambers (not shown).

Figure 6:
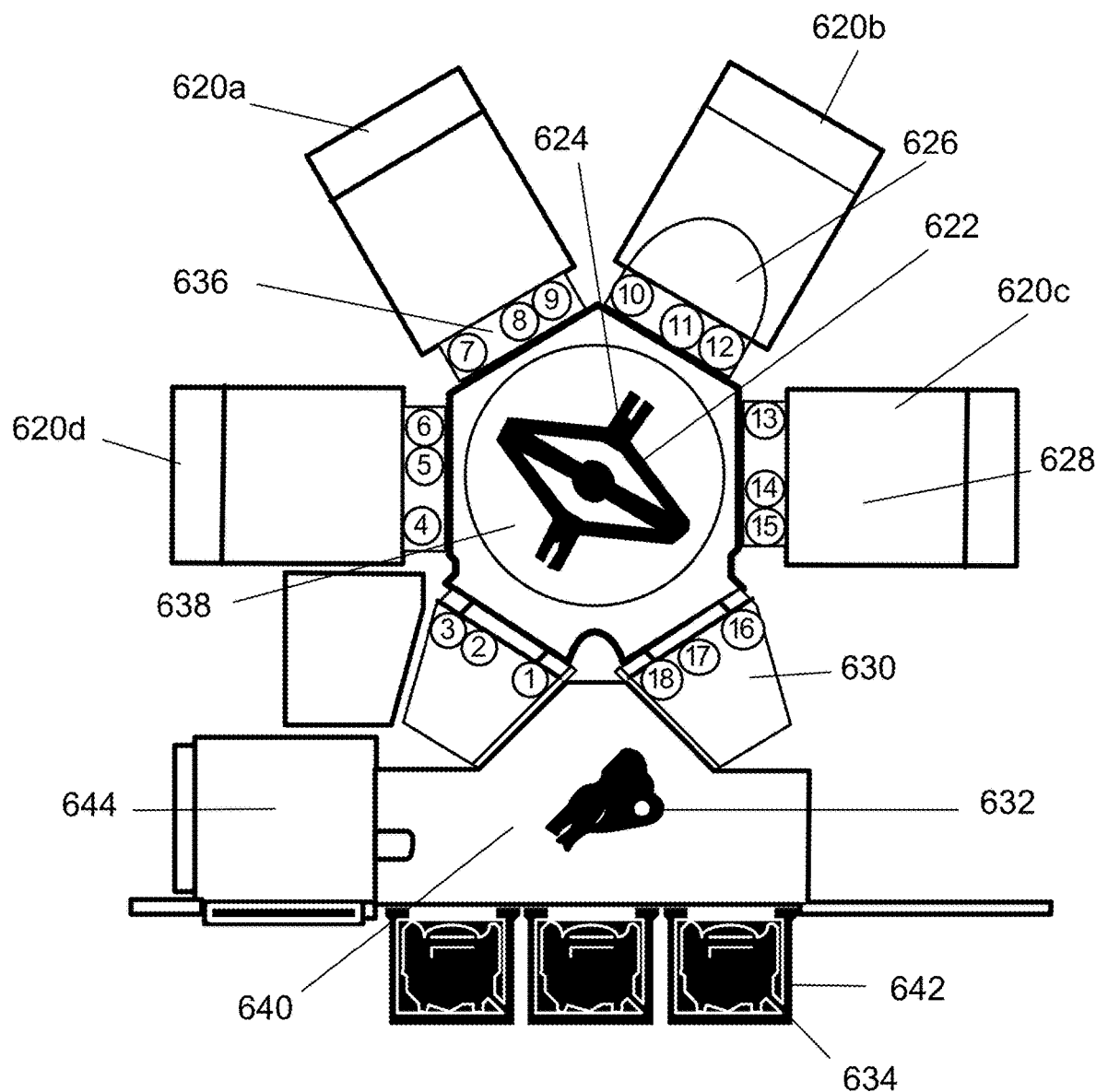
FIG. 6 is a schematic diagram of an example process apparatus for performing disclosed embodiments.

FIG. 6 depicts a semiconductor process cluster architecture with various modules that interface with a vacuum transfer module (VTM) 638. The arrangement of various modules to "transfer" wafers among multiple storage facilities and processing modules may be referred to as a "cluster tool architecture" system. Airlock 630, also known as a loadlock or transfer module, interfaces with the VTM 638 which, in turn, interfaces with four processing modules 620a-620d, which may be individual optimized to perform various fabrication processes. By way of example, processing modules 620a-620d may be implemented to perform substrate etching, deposition, ion implantation, wafer cleaning, sputtering, and/or other semiconductor processes. In some embodiments, disclosed embodiments are performed in the same module. In some embodiments, disclosed embodiments are performed in different modules of the same tool. One or more of the substrate etching processing modules (any of 620a-620d) may be implemented as disclosed herein, i.e., for performing vertical etching, for performing lateral etching, for exposing a substrate to different gases, and other suitable functions in accordance with the disclosed embodiments. Airlock 630 and processing modules 620a-620d may be referred to as "stations." Each station has a facet 636 that interfaces the station to VTM 638. Inside each facet, sensors 1-18 are used to detect the passing of wafer 626 when moved between respective stations.

Robot 622 transfers wafer 626 between stations. In one embodiment, robot 622 has one arm, and in another embodiment, robot 622 has two arms, where each arm has an end effector 624 to pick wafers such as wafer 626 for transport. Front-end robot 632, in atmospheric transfer module (ATM) 640, is used to transfer wafers 626 from cassette or Front Opening Unified Pod (FOUP) 634 in Load Port Module (LPM) 642 to airlock 630. Module center 628 inside processing module 620a-620d is one location for placing wafer 626. Aligner 644 in ATM 640 is used to align wafers.

In an exemplary processing method, a wafer is placed in one of the FOUPs 634 in the LPM 642. Front-end robot 632 transfers the wafer from the FOUP 634 to an aligner 644, which allows the wafer 626 to be properly centered before it is etched or processed. After being aligned, the wafer 626 is moved by the front-end robot 632 into an airlock 630. Because the airlock 630 has the ability to match the environment between an ATM 640 and a VTM 638, the wafer 626 is able to move between the two pressure environments without being damaged. From the airlock 630, the wafer 626 is moved by robot 622 through VTM 638 and into one of the processing modules 620a-620d. In order to achieve this wafer movement, the robot 622 uses end effectors 624 on each of its arms. Once the wafer 626 has been processed, it is moved by robot 622 from the processing modules 620a-620d to the airlock 630. From here, the wafer 626 may be moved by the front-end robot 632 to one of the FOUPs 634 or to the aligner 644.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 5A may be implemented with the tool in FIG. 6.

EXPERIMENTAL

Experiment 1

Figure 7A:
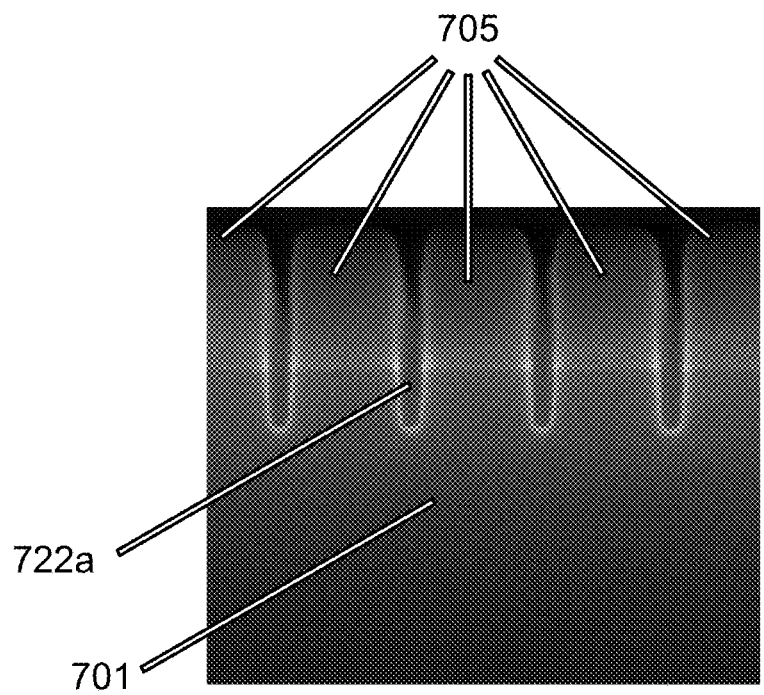
FIGS. 7A-7D are images of substrates etched in accordance with disclosed embodiments.

An experiment was conducted on silicon substrates including a patterned silicon nitride hard mask over the silicon substrate. Vertical etch was performed by exposing the substrate to a chlorine-based etch chemistry. The aspect ratio of the etched trench in the silicon was about 2:1, with a trench opening of 20 nm. FIG. 7A shows an image of the etched trench 722a in silicon substrate 701 with the patterned hard mask 705.

Figure 7B:
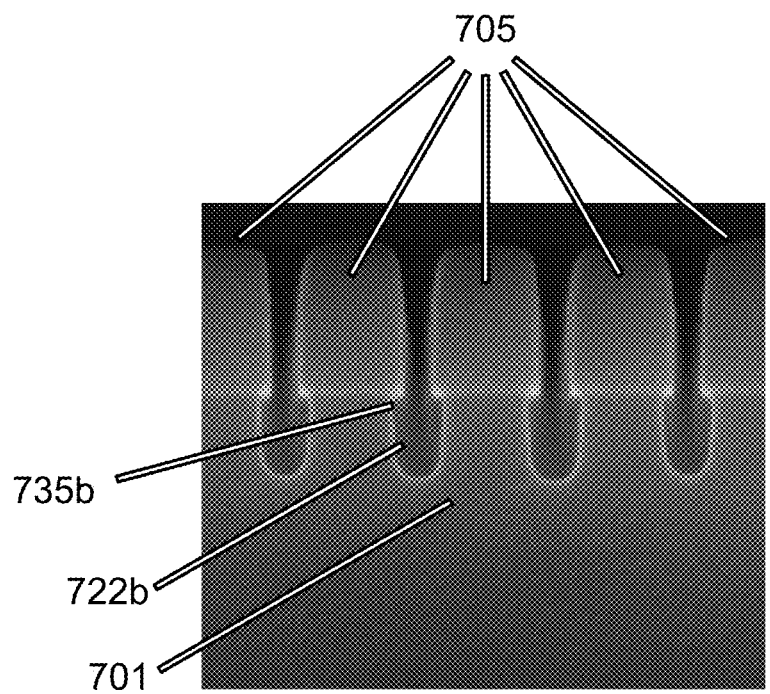

The substrate was further etched laterally by performing 1-100 cycles of: exposing the substrate to $NF_3$ and $NH_3$ in a helium environment, and sublimating at increased temperature. The resulting trench had a width of about 40 nm, with an undercut of about 10 nm. FIG. 7B shows an image of the etched trench 722b with undercut 735b in silicon substrate 701, with hard masks 705 over the substrate. Note that there was no re-deposition and etch is substantially uniform. These results illustrate the efficiency and viability of performing disclosed embodiments.

Experiment 2

Figure 7C:
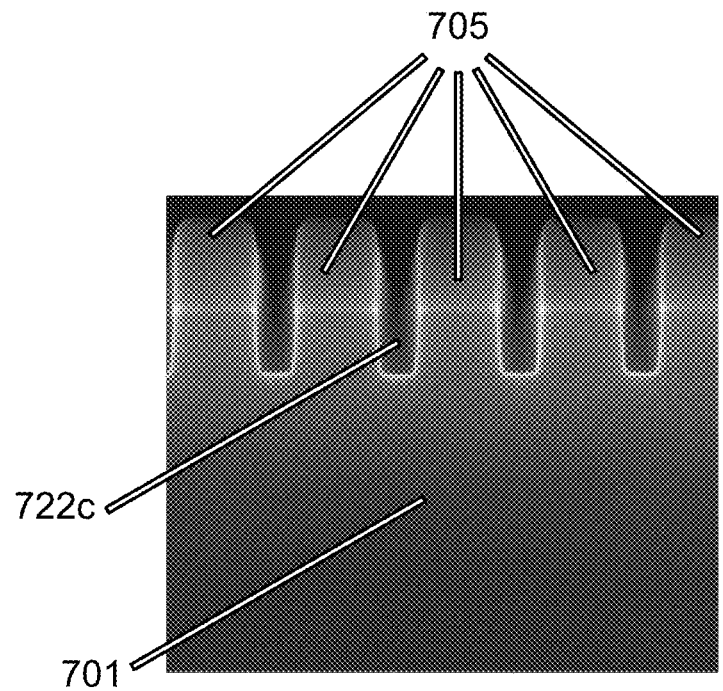

An experiment was conducted on silicon substrates including a patterned silicon nitride hard mask over the silicon substrate. Vertical etch was performed by exposing the substrate to a chlorine-based etch chemistry. The aspect ratio of the etched trench was about 1.5:1, with a trench opening of about 40 nm. FIG. 7C shows an image of the etched trench 722c in silicon substrate 701 with the patterned hard masks 705.

Figure 7D:
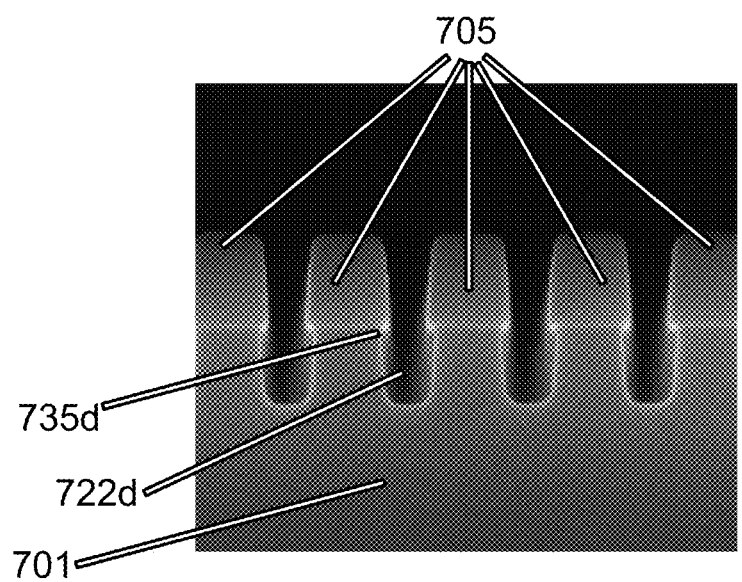

The substrate was further etched laterally by performing 1-100 cycles of: exposing the substrate to $NF_3$ and $NH_3$ in a helium environment, and sublimating at increased temperature. The resulting trench had a width of about 60 nm, with an undercut of about 10 nm. FIG. 7D shows an image of the etched trench 722d with undercut 735d in silicon substrate 701, with hard masks 705 over the substrate. Note that there was no re-deposition and etch is substantially uniform.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. An apparatus for processing a substrate, the apparatus comprising:
   a process chamber;
   a gas box having a plurality of first outlets and a second outlet that are both fluidly connected with the process chamber via a plurality of top inlets and a side inlet;
   a mixing chamber for mixing ammonia with one or more of the process gases, the mixing chamber separate from the gas box, fluidly connected to the plurality of first outlets, fluidly connected with the plurality of top inlets and the side inlet, and fluidly interposed between the first outlet, and the plurality of top inlets and the side inlet such that:
   gas is configured to flow from the plurality of first outlets, through the mixing chamber, and to the plurality of top inlets and the side inlet, and
   gas is configured to flow from the second outlet and to the plurality of top inlets and the side inlet without flowing through the mixing chamber;
   a first set of parallel valves fluidly interposed between the mixing chamber, and the plurality of top inlets and the side inlet, and configured to control the flow of gas between the mixing chamber and the plurality of top inlets and the side inlet;
   a second set of parallel valves fluidly interposed between the second outlet, and the plurality of top inlets and the side inlet, and configured to control the flow of gas between the second outlet and the plurality of top inlets and the side inlet;
   a first gas source in the gas box comprising an oxidant and fluidly connected to one of the first outlets;
   a second gas source in the gas box comprising a fluorine-containing etchant and fluidly connected to another one of the first outlets;
   a heater configured to heat a substrate in the process chamber; and
   a controller having at least one processor and a memory, wherein:
   the at least one processor and the memory are communicatively connected with one another,
   the memory stores non-transient, computer-executable instructions for controlling the at least one processor to control the gas box, the first set of parallel valves, and the second set of parallel valves to:
   (i) cause the oxidant gas to flow to the process chamber housing a substrate to conformally oxidize surface of a feature in a semiconductor layer of the substrate to form an oxidized surface,
   (ii) cause, after (i), the fluorine-containing etchant gas to flow to the process chamber housing the substrate to expose the substrate to the fluorine-containing etchant gas to isotropically etch the oxidized surface of the substrate in a self-limiting reaction selective to non-oxidized semiconductor material,
   (iii) cause, after (ii), the heater to heat the substrate to remove non-volatile solid etch byproducts by sublimation, and
   (iv) repeat (i), (ii), and (iii).

2. The apparatus of claim 1, wherein the mixing chamber is a mixing manifold.

3. The apparatus of claim 1, further comprising a third gas source in the gas box comprising ammonia and fluidically connected to one of the first outlets, wherein the memory further includes instructions to (v) cause, during (ii), the ammonia to flow from the mixing chamber to the process chamber.

4. The apparatus of claim 3, wherein the memory further includes instructions to repeat (i) through (v).

5. The apparatus of claim 1, further comprising a purge gas source comprising a purge gas, wherein the memory further includes instructions to (vi) cause, after (ii), the purge gas to flow to the process chamber.

6. The apparatus of claim 1, further comprising a fourth gas source comprising a hydrogen-containing gas, wherein the memory further includes instructions to (vii) cause, during (ii), the hydrogen-containing gas to flow to the process chamber.

7. The apparatus of claim 1, further comprising a plasma generator, wherein the memory further includes instructions to (viii) cause, during (i), the plasma generator to generate a plasma in the process chamber.

8. The apparatus of claim 1, further comprising a vacuum pump configured to evacuate gases from the process chamber, wherein the memory further includes instructions to (ix) cause the vacuum pump to set the process chamber to a chamber pressure less than about 10 Torr.

9. The apparatus of claim 8, wherein memory further includes instructions to (x) cause the vacuum pump to set the process chamber at a chamber pressure between about 5 mTorr and about 400 mTorr.

10. The apparatus of claim 1, wherein performing (i) through (iii) causes the substrate to be etched laterally.

11. The apparatus of claim 1, wherein performing (i) through (iii) removes semiconductor material in monolayer increments.

12. The apparatus of claim 1, wherein performing (i) through (iii) causes the starting and ending profile of the etched portion of the feature to have linear edges.

13. The apparatus of claim 1, wherein performing (i) through (iii) causes the semiconductor material to be laterally etched under a hard mask on the substrate.

14. The apparatus of claim 1, wherein:
   the first set of parallel valves includes a first valve and a second valve, the first valve is configured to control the flow of gas between the mixing chamber and the plurality of top inlets, the second valve is configured to control the flow of gas between the mixing chamber and the side inlet.

15. The apparatus of claim 14, wherein:

the second set of parallel valves includes a third valve and a fourth valve, the third valve is configured to control the flow of gas between the second outlet and the plurality of top inlets, the fourth valve is configured to control the flow of gas between the second outlet and the side inlet.

16. The apparatus of claim 1, further comprising a third set of valves, wherein:

the plurality of top inlets includes:
- a center gas inlet configured to flow gas onto the center of a substrate positioned on a chuck in the process chamber, and
- an edge inlet configured to flow gas onto an edge of the substrate positioned on the chuck, and the third set of valves is configured to control flow of gas to the center inlet and the side inlet.

\* \* \* \* \*